United States Patent
Ha

[19]

[11] Patent Number: 6,130,153
[45] Date of Patent: Oct. 10, 2000

[54] INTERCONNECTION FABRICATION METHOD FOR SEMICONDUCTOR DEVICE

[75] Inventor: Jae-Hee Ha, Choongcheongbuk-Do, Rep. of Korea

[73] Assignee: LG Semicon Co., Ltd., Choongcheongbuk-Do, Rep. of Korea

[21] Appl. No.: 09/166,185

[22] Filed: Oct. 5, 1998

[30] Foreign Application Priority Data

Dec. 29, 1997 [KR] Rep. of Korea ................ 97-75854

[51] Int. Cl.[7] .............................................. H01L 21/4763
[52] U.S. Cl. ................... 438/622; 438/600; 438/692; 437/50; 257/774
[58] Field of Search .................. 438/622, 692, 438/600; 437/50; 257/774

[56] References Cited

U.S. PATENT DOCUMENTS

| | | | |
|---|---|---|---|
| 4,057,460 | 11/1977 | Saxena et al. | 156/643 |
| 5,726,098 | 3/1998 | Tsuboi | 438/622 |
| 5,763,954 | 6/1998 | Hyakutake | 257/774 |
| 5,767,013 | 6/1998 | Park et al. | 438/622 |
| 5,930,667 | 7/1999 | Oda | 438/622 |
| 5,981,395 | 11/1999 | Huang et al. | 438/692 |

OTHER PUBLICATIONS

Kornblit, A. et al., "Linewidth Control in Trilevel Etching", *SPIE*, vol. 775, pp. 320–326, 1987.

*Primary Examiner*—Richard Elms
*Assistant Examiner*—Pho Luu
*Attorney, Agent, or Firm*—Morgan, Lewis & Bockius LLP

[57] ABSTRACT

An interconnection fabricating method for a semiconductor device includes the steps of forming an interconnection layer on a semiconductor substrate, forming a first photoresist layer on the interconnection layer, forming an insulation layer on the first photoresist layer, forming a second photoresist layer pattern on the insulation layer, sequentially etching the insulation layer and the first photoresist layer to obtain an insulation layer pattern and a first photoresist layer pattern, and removing the second photoresist layer pattern, removing the insulation layer pattern using dry etching, and forming an interconnection layer pattern by selectively etching the interconnection layer.

8 Claims, 2 Drawing Sheets

INTERCONNECTION FABRICATION METHOD FOR SEMICONDUCTOR DEVICE

This application claims the benefit of Korean Patent Application No. 75854/1997, filed Dec. 29, 1997, which is hereby incorporated by reference

BACKGROUND OF THE INVENTION

1. Field of the Invention

The present invention relates to a semiconductor device, and more particularly to an improved interconnection fabricating method for a semiconductor device.

2. Discussion of the Related Art

In general, a multi-layer photoresist forming technique for an interconnection fabricating method for a semiconductor device is concerned with fine interconnection patterns of less than 0.25 μm in thickness. In particular, an irregular surface of a lower layer is prevented by forming a first photoresist layer for planarization of a thick layer to facilitate an exposure process and improve its margin by forming a second photoresist layer.

FIGS. 1A through 1D are cross-sectional views illustrating a conventional interconnection fabricating method for a semiconductor device using a multi-layer photoresist technique.

As shown in FIG. 1A, an interconnection layer 13 is formed on a semiconductor substrate 11. A first photoresist layer 15 is formed on the interconnection layer 13 for planarization, and a hard bake step is carried out.

In FIG. 1B, an insulation layer 17 serving as an intermediate mask is formed on the first photoresist layer 15. A second photoresist pattern 19a is formed having a thickness of less than 0.4 μm on the insulation layer 17.

As shown in FIG. 1C, using the photoresist pattern 19a as a mask, the insulation layer 17 and the first photoresist layer 15 are dry-etched to form an insulation layer pattern 17a and a first photoresist layer pattern 15a. A hard bake step is then carried out. The photoresist layer pattern 19a is removed while the insulation layer 17 and the first photoresist layer 15 are etched. The hard bake step is performed to reinforce adhesion between the first photoresist layer 15 and the interconnection layer 13.

Referring to FIG. 1D, the insulation layer pattern 17a is removed using a wet etching method with a buffered oxide etchant (BOE), and the interconnection layer 13 is etched using the first photoresist layer pattern 15a as a mask to form a fine interconnection layer pattern 13a. The first photoresist layer pattern 15a is then removed.

However, the conventional method using a multi-layer photoresist structure has several disadvantages.

First, when the intermediate insulation layer pattern 17a is removed using a wet etching method, an additional buffered oxide etchant (BOE) container, such as a bath or a chamber, is required, increasing production cost.

Second, when the insulation layer pattern 17a is wet-etched, a lifting of the first photoresist layer pattern 15a occurs, and an additional hard bake step needs to be done prior to the wet etching step, complicating the manufacturing process.

Third, the wet etching method applied to the insulation layer pattern 17a requires a multi-step process including a BOE application, a DI-rinse (de-ionized water rinse) and a spin dry, requiring a longer processing time.

SUMMARY OF THE INVENTIONS

Accordingly, the present invention is directed to an interconnection fabricating method for a semiconductor device that substantially obviates one or more of the problems due to limitations and disadvantages of the related art.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and in accordance with the purpose of the present invention, as embodied and broadly described, in accordance with a first aspect of the present invention there is provided an interconnection fabricating method for a semiconductor device including the steps of forming an interconnection layer on a semiconductor substrate, forming a first photoresist layer on the interconnection layer, forming an insulation layer on the first photoresist layer, forming a second photoresist layer pattern on the insulation layer, sequentially etching the insulation layer and the first photoresist layer to form an insulation layer pattern and a first photoresist layer pattern, removing the second photoresist layer pattern, removing the insulation layer pattern using dry etching, and forming an interconnection layer pattern by selectively etching the interconnection layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

In the drawings:

FIGS. 1A through 1D are cross-sectional views sequentially illustrating a conventional semiconductor device interconnection fabricating method; and FIGS. 2A through 2D are cross-sectional views sequentially illustrating a semiconductor device interconnection fabricating method according to the present invention.

DETAILED DESCRIPTION OF THE PREFERRED EMBODIMENT

Reference will now be made in detail to the preferred embodiment of the present invention, an example of which is illustrated in the accompanying drawings.

Figure 1A:
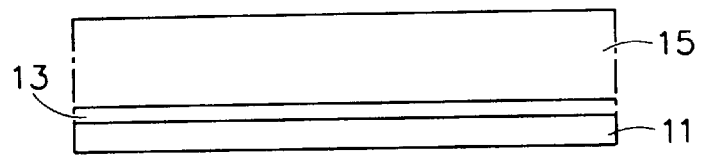
Figure 1B:
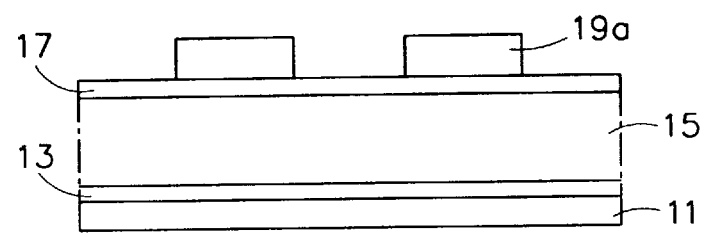
Figure 1C:
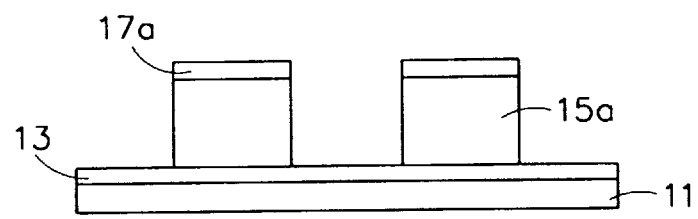
Figure 1D:
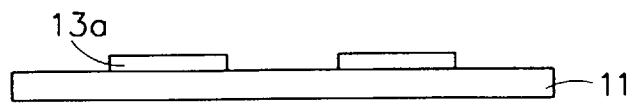
Figure 2A:
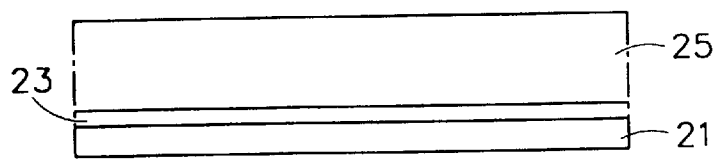

As shown in FIG. 2A, an interconnection layer 23 is formed on a semiconductor substrate 21. A first photoresist layer 25 is formed on the interconnection layer 23 for planarization. The interconnection layer 23 is preferably formed of aluminum.

Figure 2B:
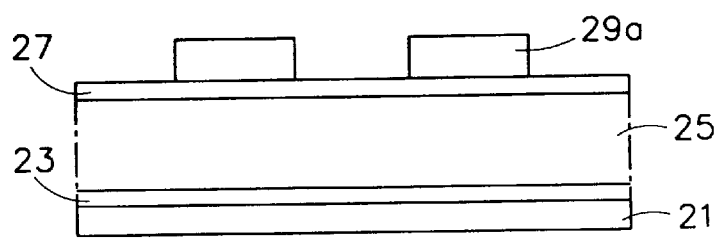

As shown in FIG. 2B, an insulation layer 27 serving as an intermediate mask is formed at a low temperature on the first photoresist layer 25. A second photoresist pattern 29a is formed on the insulation layer 27. The insulation layer 27 is preferably an oxide or a nitride. The first photoresist layer 25 is thicker than the second photoresist layer pattern 29a.

Figure 2C:
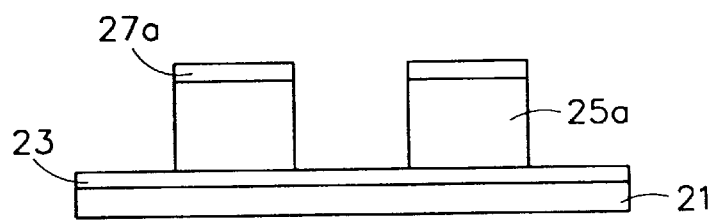

As shown in FIG. 2C, using the second photoresist pattern 29a as a mask, the insulation layer 27 and the first photoresist layer 25 are dry-etched to form an insulation layer pattern 27a and a first photoresist layer pattern 25a. The second photoresist layer pattern 29a is also etched while the insulation layer 27 and the first photoresist layer 25 are selectively etched. The insulation layer 27 is etched using a plasma including fluorine as a reaction source, and the first photoresist layer 25 is etched using a plasma including oxygen as a reaction source.

Figure 2D:
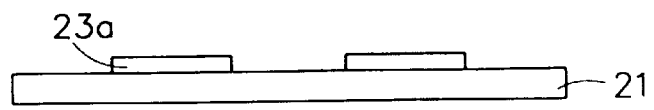

Finally, as shown in FIG. 2D, the insulation layer pattern 27a is removed using a dry etching method. The interconnection layer 23 is etched using the first photoresist layer pattern 25a as a mask to form an interconnection layer pattern 23a, and the first photoresist layer pattern 24a is removed. The removal of the insulation layer pattern 27a employs a fluorine plasma without carbon, or a compound fluorine plasma including a gas such as $N_2$ or $SO_2$. When the fluorine plasma without carbon is employed as a reaction source, bias power for an etching apparatus is adjusted to be lower than 100 W.

As described above, the semiconductor device interconnection fabricating method of the present invention etches the intermediate insulation layer using a wet etching technique to prevent a lifting of the first photoresist layer. Therefore, a hard bake step required in the conventional wet etching method may be omitted, shortening the processing time and simplifying the interconnection fabricating steps.

Further, the semiconductor device interconnection fabricating method according to the present invention does not require an additional BOE container such as a bath or a chamber that is necessary in the conventional wet etching, decreasing production cost.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. An interconnection fabricating method for a semiconductor device comprising the steps of:

forming an interconnection layer on a semiconductor substrate;

forming a first photoresist layer on the interconnection layer;

forming an insulation layer on the first photoresist layer;

forming a second photoresist layer pattern on the insulation layer;

sequentially etching the insulation layer and the first photoresist layer to form an insulation layer pattern and a first photoresist layer pattern;

removing the second photoresist layer pattern;

removing the insulation layer pattern using dry etching; and forming an interconnection layer pattern by selectively etching the interconnection layer, wherein the step of forming the interconnection layer includes forming an aluminum layer.

2. An interconnection fabricating method for a semiconductor device comprising the steps of:

forming an interconnection layer on a semiconductor substrate;

forming a first photoresist layer on the interconnection layer;

forming an insulation layer on the first photoresist layer;

forming a second photoresist layer pattern on the insulation layer;

sequentially etching the insulation layer and the first photoresist layer to form an insulation layer pattern and a first photoresist layer pattern;

removing the second photoresist layer pattern;

removing the insulation layer pattern using dry etching; and forming an interconnection layer pattern by selectively etching the interconnection layer, wherein the step of forming the insulation layer includes forming at least one of an oxide layer and a nitride layer.

3. An interconnection fabricating method for a semiconductor device comprising the steps of:

forming an interconnection layer on a semiconductor substrate;

forming a first photoresist layer on the interconnection layer;

forming an insulation layer on the first photoresist layer;

forming a second photoresist layer pattern on the insulation layer;

sequentially etching the insulation layer and the first photoresist layer to form an insulation layer pattern and a first photoresist layer pattern;

removing the second photoresist layer pattern;

removing the insulation layer pattern using dry etching; and forming an interconnection layer pattern by selectively etching the interconnection layer, wherein the step of sequentially etching the insulation layer uses a plasma including fluorine as a reaction source.

4. An interconnection fabricating method for a semiconductor device comprising the steps of:

forming an interconnection layer on a semiconductor substrate;

forming a first photoresist layer on the interconnection layer;

forming an insulation layer on the first photoresist layer;

forming a second photoresist layer pattern on the insulation layer;

sequentially etching the insulation layer and the first photoresist layer to form an insulation layer pattern and a first photoresist layer pattern;

removing the second photoresist layer pattern;

removing the insulation layer pattern using dry etching; and forming an interconnection layer pattern by selectively etching the interconnection layer, wherein the step of sequentially etching the insulation layer and the first photoresist layer etches the first photoresist layer with a plasma including oxygen as a reaction source.

5. An interconnection fabricating method for a semiconductor device comprising the steps of:

forming an interconnection layer on a semiconductor substrate;

forming a first photoresist layer on the interconnection layer;

forming an insulation layer on the first photoresist layer;

forming a second photoresist layer pattern on the insulation layer;

sequentially etching the insulation layer and the first photoresist layer to form an insulation layer pattern and a first photoresist layer pattern;

removing the second photoresist layer pattern;

removing the insulation layer pattern using dry etching; and forming an interconnection layer pattern by selectively etching the interconnection layer, wherein the step of forming the interconnection layer pattern etches the interconnection layer using a fluorine plasma without carbon as a reaction source.

6. The method of claim 5, wherein the step of forming the interconnection layer pattern employs a bias power of an etching apparatus of less than about 100 W.

7. An interconnection fabricating method for a semiconductor device comprising the steps of:

forming an interconnection layer on a semiconductor substrate;

forming a first photoresist layer on the interconnection layer;

forming an insulation layer on the first photoresist layer;

forming a second photoresist layer pattern on the insulation layer;

sequentially etching the insulation layer and the first photoresist layer to form an insulation layer pattern and a first photoresist layer pattern;

removing the second photoresist layer pattern;

removing the insulation layer pattern using dry etching; and forming an interconnection layer pattern by selectively etching the interconnection layer, wherein the step of removing the insulation layer pattern using dry etching uses a compound fluorine plasma including $N_2$ gas or $SO_2$ gas as a reaction source.

8. An interconnection fabricating method for a semiconductor device comprising the steps of:

forming an interconnection layer on a semiconductor substrate;

forming a first photoresist layer on the interconnection layer;

forming an insulation layer on the first photoresist layer;

forming a second photoresist layer pattern on the insulation layer;

sequentially etching the insulation layer and the first photoresist layer to form an insulation layer pattern and a first photoresist layer pattern;

removing the second photoresist layer pattern;

removing the insulation layer pattern using dry etching; and forming an interconnection layer pattern by selectively etching the interconnection layer, wherein the step of forming a first photoresist layer forms a layer that is thicker than the second photoresist layer.

* * * * *